(12) United States Patent
Takenaka

(10) Patent No.: US 6,339,008 B1
(45) Date of Patent: Jan. 15, 2002

(54) METHOD OF MANUFACTURING A SEMICONDUCTOR MEMORY DEVICE

(75) Inventor: Nobuyuki Takenaka, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/429,000

(22) Filed: Oct. 28, 1999

(30) Foreign Application Priority Data

Oct. 30, 1998 (JP) .......................................... 10-309290

(51) Int. Cl.$^7$ .............................................. H01L 21/20
(52) U.S. Cl. ...................... 438/396; 438/239; 438/253; 438/737
(58) Field of Search ................................ 438/171, 190, 438/210, 238–240, 253, 396, 717, 736–738

(56) References Cited

U.S. PATENT DOCUMENTS

| 5,831,299 A | * 11/1998 | Yokoyama et al. ......... 257/295 |
| 5,843,830 A | * 12/1998 | Graettinger et al. ........ 438/396 |
| 5,998,258 A | * 12/1999 | Melnick et al. ............. 438/253 |
| 6,093,575 A | * 7/2000 | Eguchi ........................... 438/3 |
| 6,153,525 A | * 11/2000 | Hendricks et al. .......... 438/692 |

FOREIGN PATENT DOCUMENTS

JP           9-135007 A        5/1997

* cited by examiner

Primary Examiner—Carl Whitehead, Jr.
Assistant Examiner—Jamie L. Brophy
(74) Attorney, Agent, or Firm—Nixon & Vanderhye P.C.

(57) ABSTRACT

A method of manufacturing a semiconductor memory device, which includes: a step of laminating and flattening a first interlayer insulating film on a semiconductor substrate provided with a semiconductor element having a diffusion region and then forming a contact hole in the first interlayer insulating film on the semiconductor element, a step of forming a contact plug by burying a contact plug material into the contact hole, a step of laminating a first electrode material forming a lower electrode for a capacitor so as to cover at least the contact plug and forming a lower electrode on the contact plug by patterning using a first mask, a step of forming a second interlayer insulating film so as to cover the lower electrode, and flattening the second interlayer insulating film until the surface of the second interlayer insulating film reaches a height identical with the surface of the lower electrode, a step of forming a ferroelectric material film and a second electrode material film forming an upper electrode for the capacitor in this order at least on the surface of the lower electrode, a step of forming an upper electrode by patterning the second electrode material using a second mask and a step of forming a ferroelectric film by patterning the ferroelectric material film using a third mask.

7 Claims, 2 Drawing Sheets

METHOD OF MANUFACTURING A SEMICONDUCTOR MEMORY DEVICE

CROSS-REFERENCE TO RELATED APPLICATION

This application is related to Japanese application No. Hei 10(1998)-309290 filed on Oct. 30, 1998, whose priority is claimed under 35 USC §119, the disclosure of which is incorporated by reference in its entirety.

BACKGROUND OF THE INVENTION

1. Field of the Invention

The present invention concerns a method of manufacturing a semiconductor memory device having a capacitor structure in which a ferroelectric film is disposed as a capacitance insulating film.

2. Description of the Related Art

In recent years, ferroelectric non-volatile memories (FeRAM) having high density and operating at high speed have been developed vigorously. As a background therefor, it can be mentioned that the amount of accumulated charges decreases with refinement of memory cells. Therefore, ferroelectric films having much higher dielectric constant than that of silicon oxide films or silicon nitride films used so far have become in use as the capacitance insulating films.

Further, for making three dimensional structures, a stack structure has been proposed in which a plug comprising polysilicon or tungsten is formed on the source of MOSEFT and capacitor is formed thereon.

A method of forming such a conventional non-volatile memory having the stack structure, particularly, a capacitor with a ferroelectric film, is to be explained below with reference to FIG. 2.

At first, a semiconductor element having a diffusion region 12 is formed on the surface of a semiconductor substrate 17. Subsequently, an interlayer insulating film 11 is formed on the semiconductor element and flattened. Thereafter, a contact hole is opened on the diffusion region 12, where a contact plug 13 is formed (FIG. 2(a)).

Subsequently, films of a lower barrier metal material 15a, a lower electrode material 14a, a ferroelectric material 18a and an upper barrier metal (not illustrated) are successively formed, on which a film of an upper electrode material 19a is formed (FIG. 2(b)).

After forming all this series of films, if the different films in three layers made of the upper electrode material 19a (including upper barrier metal), the ferroelectric material 18a and the lower electrode material 14a (including lower barrier metal) can be etched continuously by using an identical mask, there is no need for taking misalignment of the layers into consideration. For this purpose, it is required for the etching conditions applicable in common with the three layers to provide a high selective ratio with respect to the masking material.

However, since a vapor pressure of reaction products formed by reaction with an etching gas in dry etching is extremely low, etching proceeds in each of the electrode materials only under an etching condition with an importance being attached to a physical sputtering effect mainly by ion impact. Accordingly, it has been extremely difficult to obtain an etching condition having a high selective ratio between the mask materials and the underlying materials and, accordingly, it has been difficult to pattern the series of films by an identical mask material.

For this reason, in the existent method, patterning has to be conducted while re-preparing masks on every layer, as shown in FIG. 2(c) to FIG. 2(e), in such a manner that an upper electrode 19 is formed with a first mask (FIG. 2(c)), then a ferroelectric film 18 is formed with a second mask (FIG. 2(d)) and, further, a lower electrode 14 is formed with a third mask (FIG. 2(e)). Patterning is conducted so that a pattern of an upper layer does not extend beyond a pattern of a lower layer in consideration of potential misalignment between the layers.

Further, in Japanese Patent Laid-Open No. 135007/1997, a method other than that described above has been proposed. The method of manufacturing a semiconductor device described in this publication is to be explained below as another existent example.

In this existent example, after forming a lower electrode by pattering, a first insulating film is formed thereon and then it is flattened by etching back. Then, a second insulating film is deposited, a hole is disposed to the second insulating film at a position corresponding to the lower electrode, a ferroelectric film is formed over the entire surface on the second insulating film including the hole and then only the ferroelectric film on the second insulating film is removed selectively by a chemical-mechanical polishing (CMP) method, thereby to bury the ferroelectric film and, successively, an upper electrode is formed.

As a result, fine patterning of the ferroelectric film is enabled without using dry etching.

However, in the existent example shown in FIG. 2, while the problem involved in the dry etching patterning described above can be avoided by re-preparation of masks on every layer, the mask size has to be determined considering an alignment margin on every layer. As a result, the size is made smaller in the order of the lower electrode 14, the ferroelectric film 18 and the upper electrode 19, so that the cell size of the capacitor is enlarged compared with a case of applying pattering by using an identical mask. That gives rise to a problem from the viewpoint of refinement.

Further, the second existent example shows the method of depositing the first insulating film on the lower electrode, then flattening the first insulating film, further depositing the second insulating film, then disposing the hole to the second insulating film at the position corresponding to the lower electrode and burying the ferroelectric film. That is, the ferroelectric film is formed on the underlying layer having an evenness on the lower electrode formed by removing the first and the second insulating films. Further, an unetched portion is liable to be caused due to a step formed between the surface of the second insulating film and the surface of the lower electrode. Accordingly, it is difficult to obtain stable film characteristics for the ferroelectric film.

In addition, there is also another problem that no convenient slurry (polishing chemical liquid) suitable to ferroelectric material to be used in the succeeding CMP step has yet been developed.

SUMMARY OF THE INVENTION

The present invention provides a method of manufacturing a semiconductor memory element, which comprises:
- a step of laminating and flattening a first interlayer insulating film on a semiconductor substrate provided with a semiconductor device having a diffusion region and then forming a contact hole in the first interlayer insulating film on the semiconductor element,
- a step of forming a contact plug by burying a contact plug material into the contact hole,
- a step of laminating a first electrode material forming a lower electrode for a capacitor so as to cover at least the contact plug and forming a lower electrode on the contact plug by patterning using a first mask, a step of forming a second interlayer insulating film so as to cover the lower electrode, and flattening the second interlayer insulating film until the surface of the second interlayer insulating film reaches a height identical with the surface of the lower electrode, a step of forming a ferroelectric material film and a second electrode material film forming an upper electrode for the capacitor in this order at least on the surface of the lower electrode, a step of forming an upper electrode by patterning the second electrode material using a second mask and a step of forming a ferroelectric film by patterning the ferroelectric material film using a third mask.

An example of a method of manufacturing a semiconductor memory device according to the present invention is to be explained with reference to FIG. 1(a) to FIG. 1(e), but the constitution of the invention is not restricted to the figures.

In FIG. 1, are shown a first interlayer insulating film 1, a diffusion region 2 of a semiconductor device, a contact plug 3, a lower electrode 4, a barrier metal 5 of the lower electrode 4, a second interlayer insulating film 6, a semiconductor substrate 7, a ferroelectric material film 8a, ferroelectric film 8, an upper electrode material film 9a as the second electrode material, an upper electrode 9 and a semiconductor memory device 10.

At first, in FIG. 1(a), the first interlayer insulating film 1 is laminated on the semiconductor substrate 7 provided with the semiconductor element having the diffusion region 2, the first interlayer insulating film 1 is flattened, and then a contact hole 3a is formed in the first interlayer insulating film 1 on the semiconductor device 2. Then, a contact plug material is buried in the contact hole 3a to form the contact plug 3.

In FIG. 1(b), a first electrode material to form the lower electrode of a capacitor is deposited so as to cover the contact plug 3 and then the lower electrode 4 is formed on the contact plug 3 by pattering using a first mask not illustrated. Further, the second interlayer insulating film 6 is formed so as to cover the lower electrode 4.

Then, in FIG. 1(c), the second interlayer insulating film 6 is flattened by chemical-mechanical polishing until the surface of the second interlayer insulating film 6 reaches a height identical with that of the surface of the lower electrode 4.

In FIG. 1(d), the ferroelectric material film 8a and the second electrode material film 9a forming the upper electrode 9 of the capacitor are formed in this order on the second interlayer insulating film 6 including the lower electrode 4.

Then, in FIG. 1(e), the upper electrode 9 is formed by pattering the second electrode material film 9a by etching using a second mask not illustrated and then the ferroelectric film 8 is formed on the lower electrode 4 by patterning the ferroelectric material film 8a by etching using a third mask not illustrated.

As can be seen from FIG. 1(c)–FIG. 1(e), since the surface of the lower electrode 4 buried with the second interlayer insulating film 6 is flattened by chemical-mechanical polishing until it reaches a height identical with that of the second inter layer insulating film 6, the ferroelectric film 8 formed on the surface as an underlying layer is prevented from degradation of characteristics or peeling from the underlying layer.

The semiconductor substrate 7 in this invention can include, for example, an Si substrate and a GaAs substrate.

The semiconductor element can include, for example, a MOSFET, a bipolar transistor, and a CCT. The diffusion layer can include, for example, a source, a drain, an emitter, a collector and a base.

The first interlayer insulating film 1 and the second interlayer insulating film 6 may can include a plasma oxide film, $SiO_2$ film, a SiN film, a PSG film and a SOG film.

The contact plug 3 is made of a metal film such as of Al, Cu or W. Further, a barrier metal layer such as made of Ti, TiN, TiN/Ti can be formed on the surface of the contact plug.

The lower electrode 4 in this invention is made of a metal film such as of PT, Ir, $Ir/IrO_2$ or $SrRuO_3$. Further, a barrier metal layer such as of TaSiN, TiN, TiAlN and HfSiN may be formed as a underlayer therefor.

The ferroelectric film 8 in this invention can include those made of, for example, $SrBi_2Ta_2O_9$, $BaBi_2Nb_2O_9$, $BaBi_2TaO_9$, $PbBi_2Nb_2O_9$, $PbBi_4TiO_{15}$, $BaBi_4Ti_4O_{15}$, $Sr_2Bi_4Ti_5O_{18}$, $Ba_2Bi_4Ta_5O_{18}$, $Pb_2Bi_4Ti_5O_{18}$, $Na_{0.5}Bi_{4.5}Ti_4O_{15}$, $K_{0.5}Bi_{4.5}Ti_4O_{15}$, $SrBi_2(Ta_xNb_{1-x})_2O_9$, $(SrBi_2Ta_2O_9)_{0.7} \cdot (Bi_3TiTaO_9)_{0.3}$, $(SrBi_2(Ta_xNb_{1-x})_2O_9)_{0.7} \cdot (Bi_3TiTaO_9)_{0.3}$, or $Bi_4Ti_3O_{12}$.

As the method of forming the ferroelectric film 8, an MOD method, a sputtering method, a vacuum vapor deposition method or an MOCVD method can be used.

The thickness of the ferroelectric film 8 is usually from about 50 nm to about 300 nm.

The upper electrode 9 in this invention is made of a film of metal such as Pt, Ir, $IrO_2$, $Ir/IrO_2$ or $SrRuO_3$. The thickness of the upper electrode 9 film is from about 50 nm to about 400 nm.

For the first mask used in this invention, a photoresist mask for semiconductor is used usually.

The mask for forming the upper electrode and the ferroelectric film may be one identical mask or masks of two different sizes. Explanation is to be made to a case of using separate masks, namely, using a second mask for forming the upper electrode and a third mask for forming the ferroelectric film.

As the second mask, a photoresist mask for semiconductor like that for the first mask is used and the size of the second mask is preferably identical with that of the first mask in order to make the size of the lower electrode material 4 identical with that of the upper electrode 9.

For the third mask, a photoresist mask for semiconductor is used like that for the first and the second mask, and the size of the third mask is preferably slightly larger than that of the second mask in order to ensure a predetermined alignment margin relative to the lower electrode 4 and the upper electrode 9.

Further, in this invention, both the layers made of the upper electrode material film 9a and the ferroelectric material film 8a can be etched by using one mask (second mask), by which the ferroelectric film 8 and the upper electrode 9 can be formed on the lower electrode 4. In this case, the above-mentioned third mask is not necessary and it is not required to consider the misalignment of masks for each of the layers in forming the ferroelectric film 8 and the upper electrode 9. The size of the mask in this case is preferably identical with that of the first mask or slightly larger than that of the first mask in order to ensure an alignment margin. For etching both of the layers of the upper electrode material film 9a and the ferroelectric material film 8a by using a mask, that is, by one photoresist processing, it is preferred to apply the mask previously to a large thickness of 200 nm or more, more preferably, 200 nm to 400 nm considering the reduction of the mask film during etching.

The chemical-mechanical polishing in this invention, it can be exemplified by polishing conducted by using an alkali liquid or slurrified polishing material containing abrasive grains of silica or the like.

PREFERRED EMBODIMENT OF THE INVENTION

Figure 1:
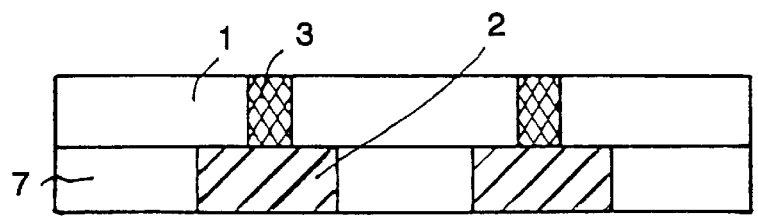
FIGS. 1(a)–(e) show a scheme of the manufacture of a semiconductor memory device according to the present invention.
Figure 1:
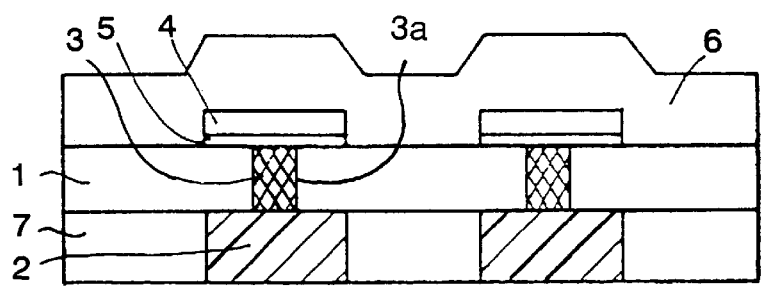
Figure 1:
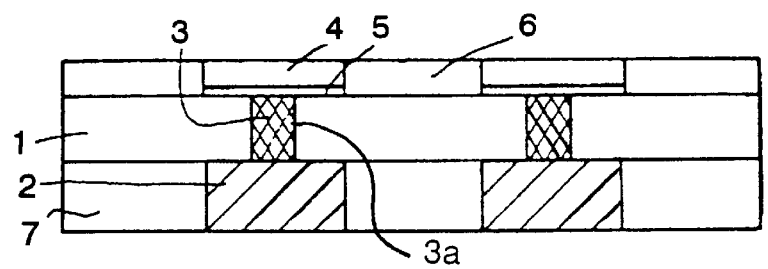
Figure 1:
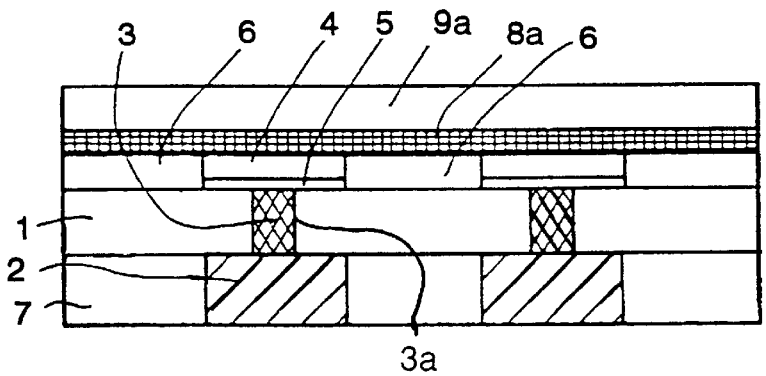
Figure 1:
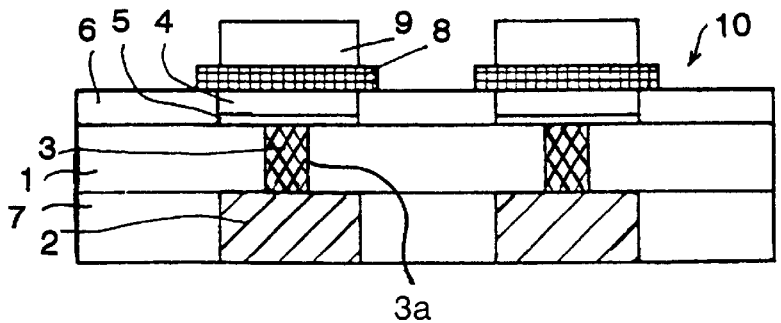
Figure 2:
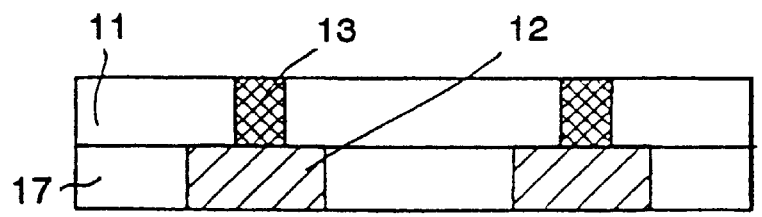
FIGS. 2(a)–(e) show a scheme of the manufacture of a semiconductor memory device according to the prior art.
Figure 2:
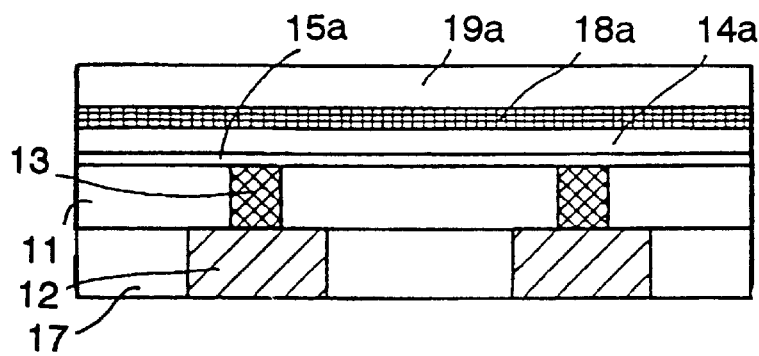
Figure 2:
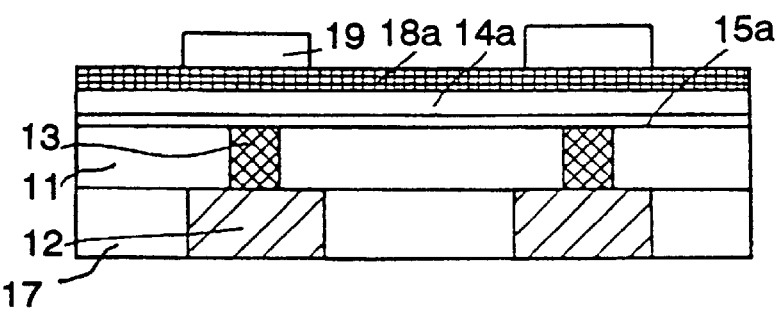
Figure 2:
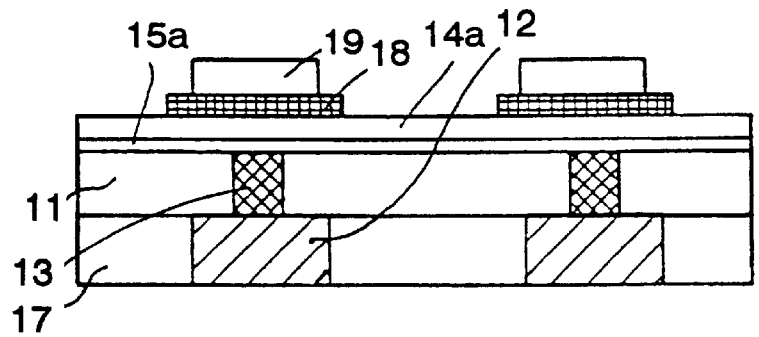
Figure 2:
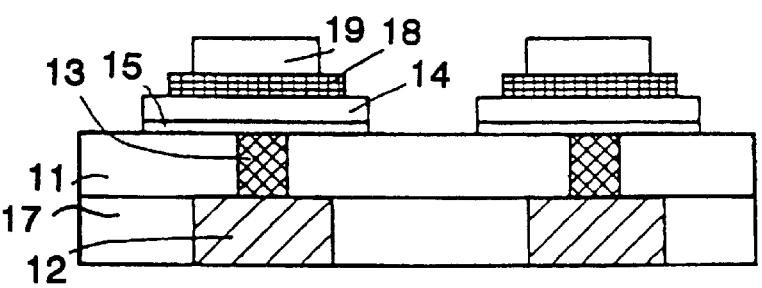

A method of manufacturing a semiconductor memory device according to this invention is to be explained with reference to examples of referred embodiments.

EXAMPLE 1

At first, an interlayer insulating film 1 is formed on a semiconductor substrate 7 on which anMOSEFT as a semiconductor element having a diffusion region 2 is formed, and the interlayer insulating film 1 was flattened by a CMP method. For electrical connection between a lower electrode 4 and the diffusion region 2, a contact plug 3 was formed in the flattened interlayer insulating film 1.

For forming the contact plug 3, a contact hole 3a was formed by RIE, a titanium nitride (TiN) film/titanium(Ti) film (50 nm/30 nm) was formed as a barrier metal by a sputtering method and then a tungsten (W) film (600 nm) was formed by CVD. Subsequently, the tungsten film only on the interlayer insulating film 1 was selectively removed by the RIE etching back method or the CMP method, to form the contact plug 3 and obtain a flat underlying surface at the same time(FIG. 1(a)).

Then, the barrier metal 5 of a titanium oxide ($TiO_2$) film (30 nm) and a platinum (Pt) film (200 nm) were successively formed as the first electrode material by the sputtering method so as to cover the contact plug 3. Subsequently, a resist pattern (not illustrated) is formed at a desired position, and the titanium nitride film and the platinum film were patterned using the resist pattern as the first mask by dry etching, to form the lower electrode 4 on the contact plug 3.

Patterning was carried out by using a dry etching apparatus having an ECR type plasma generation source under patterning conditions at a microwave power of 1000 W, a coil current of 20A, an etching gas flow rate of 40 sccm for $Cl_2$, 40 sccm for $C_2F_6$ and 5 sccm for $CH_4$, an RF power of 150 W and a pressure of 2 mTorr, and 15% over etching was conducted after exposing the underlying oxide film.

Then, after peeling off the first mask, a plasma oxide film (600 nm) was formed as the second interlayer insulating film 6 so as to cover the lower electrode 4. The plasma oxide film 6 as the second interlayer insulating film 6 has a merit in that a commercial slurry can be used in the subsequent CMP step.

The film was formed to a predetermined thickness by a plasma CVD method while controlling the time under the film forming conditions, under the film forming conditions at a pressure of 8 Torr, a deposition temperature of 400° C., an RF power of 700 W, a gas flow rate of 800 sccm for tetraethyl orthosilicate (TEOS) and of 600 sccm for $O_2$ (FIG. 1(b)).

Subsequently, the second interlayer insulating film 6 was polished and flattened by the CMP method until it was flattened at the same height as the surface of the platinum film as the lower electrode 4. Polishing was conducted until the platinum film forming the lower electrode 4 was exposed by controlling the time by using a fumed silica type slurry and a polishing cloth of foamed urethane under the polishing conditions at a number of rotation of a polishing disk of 28 rpm, the number of rotation of a carrier meshing with the polishing disk at 32 rpm, under a polishing pressure of 7 psi and at a slurry flow rate of 150 sccm (FIG. 1(c)).

Successively, a ferroelectric material film 8a was formed on the surface of the flattened lower electrode 4 formed by the CMP method. More particularly, an $SrBi_2Ta_2O_9$ solution (mix ratio of the solution: Sr/Bi/Ta=8/24/20) was coated to a thickness of about 50 nm on the lower electrode 4 by spin coating and dried at 250° C. for 5 min. This process was repeated four times intotal, there by to form an $SrBi_2Ta_2O_9$ of 200 nm thickness. Then, heat treatment was applied in an oxygen atmosphere at a substrate temperature of 700 to 800° C. for 60 min to conduct crystallization. In this stage, since the underlying layer was flattened by CMP, it is possible to form a ferroelectric film 8 having good film characteristics.

A platinum film (100 nm) as an upper electrode material film 9a was formed successively by a sputtering method on the thus crystallized ferroelectric material film 8a (FIG. 1(d)). Then, for the upper electrode material film 9a, a resist mask of about the same sizes as the lower electrode 4 was aligned relative to the lower electrode 4 and patterning was applied by dry etching under the same condition as that for the lower electrode 4 using the resist mask as the second mask. Since the underlying layer was flattened before the patterning of the upper electrode material layer 9a, there was no problem such as presence of unetched portion in the stepped portion.

After peeling the resist as the second mask, for patterning the ferroelectric material film 8a, a resist mask of a size with an alignment margin of about 200 nm on each side beyond the lower electrode 4 and the upper electrode 9 was formed, and the ferroelectric material film 8a was patterned by dry etching using the resist mask as the third mask. Patterning was carried out using a dry etching apparatus having an ECR type plasma generation source, under the patterning conditions at a microwave power of 1000 W, a coil current of 20A, an etching gas flow rate of 40 sccm for Ar and 40 sccm for $C_2F_6$, an RF power of 100 W and a pressure of 1.5 mTorr, and 15% overetching was conducted after the exposure of the overlying oxide film.

Also in the patterning of the ferroelectric film 8, since the surface of the ferroelectric material 8 was flat, there was no problem such as unetched portions as described above.

An aimed semiconductor memory device 10 was obtained by way of the steps as described above.

EXAMPLE 2

Then, the second embodiment of this invention is to be explained.

In Example 2, like Example 1, after depositing the ferroelectric material film 8a and the upper electrode material film 9a on the lower electrode 4, the ferroelectric film 8 and the upper electrode 9 were patterned by dry etching using only the second mask of the same size as used in Example 1.

In the case of forming the upper electrode 9 and the ferroelectric film 8 using one mask in common, since the film thickness of the resist mask is decreased, the resist mask was coated to a larger thickness (about 200 nm or more) considering the decrease of its thickness for a device including the smallest line width that the resist patterning could provide through exposure and development. Thereby the upper electrode 9 and the ferroelectric film 8 could be formed by patterning with no misalignment.

As has been described above, specifically, in the method according to this invention, since the ferroelectric film can be formed on the lower electrode having a flat surface with no unevenness as the underlying layer, the film quality of the ferroelectric material is satisfactory. Further, even if the mask material is formed for every layer to be etched, enlargement in the size of each of the electrodes and the ferroelectric film due to alignment margins of the masks can be minimized.

Further, in the patterning of the laminate structure of the electrode material and the ferroelectric material difficult to ensure a high selective ratio with respect to the resist mask, the patterning can be facilitated by forming masks on every layer while suppressing the enlargement of the size of each of the electrodes and the ferroelectric material due to alignment margins. As a result, the enlargement of the size for each of the electrode and the ferroelectric film considering the alignment margin can be suppressed greatly.

Furthermore, since the upper electrode material and the ferroelectric material are flattened, the alignment accuracy is not deteriorated even by using a photoresist pattern of larger thickness than usual. Accordingly, it is possible to etch the upper electrode material and the ferroelectric material by using an identical mask of resist pattern and accordingly to obtain a semiconductor memory device having substantially the same size between the upper electrode and the lower electrode.

What is claimed is:

1. A method of manufacturing a semiconductor memory device, the method comprising:

laminating a first interlayer insulating film on a semiconductor substrate provided with a semiconductor element having a diffusion region and then forming a contact hole in the first interlayer insulating film on the semiconductor element, forming a contact plug by burying a contact plug material into the contact hole, laminating a first electrode material forming a lower electrode for a capacitor so as to cover at least the contact plug and forming a lower electrode on the contact plug by patterning the first electrode material using a first mask, forming a second interlayer insulating film so as to cover the lower electrode, and flattening the second interlayer insulating film until the surface of the second interlayer insulating film reaches a height identical with a surface of the lower electrode, forming a ferroelectric material film and a second electrode material film forming an upper electrode for the capacitor in this order at least on the surface of the lower electrode, forming the upper electrode by patterning the second electrode material, forming a ferroelectric film by patterning the ferroelectric material film, and patterning the ferroelectric material film and the second electrode material using a single mask at least 200 nm thick in a manner so that the upper and lower electrodes are the same size.

2. A method of manufacturing a semiconductor memory device as defined in claim 1, wherein the second interlayer insulating film is flattened by chemical-mechanical polishing until the surface of the second interlayer insulating film reaches a height identical with that of the surface of the lower electrode.

3. A method of manufacturing a semiconductor memory device as defined in claim 2, wherein the chemical-mechanical polishing is conducted by using a slurry of fumed silica obtained by a thermal decomposition method and using a polishing cloth of foamed urethane.

4. A method of manufacturing a semiconductor memory device as defined in claim 1, wherein the upper electrode and the lower electrode are formed of Pt, Ir, $IrO_2$, Ir—$IrO_2$ mixture or $SrRuO_3$.

5. A method of manufacturing a semiconductor memory device as defined in claim 1, wherein the ferroelectric film is formed of $SrBi_2Ta_2O_9$, $BaBi_2Nb_2O_9$, $BaBi_2TaO_9$, $PbBi_2Nb_2O_9$, $PbBi_4TiO_{15}$, $BaBi_4Ti_4O_{15}$, $Sr_2Bi_4Ti_5O_{18}$, $Ba_2Bi_4Ta_5O_{18}$, $Pb_2Bi_4Ti_5O_{18}$, $Na_{0.5}Bi_{4.5}Ti_4O_{15}$, $K_{0.5}Bi_{4.5}Ti_4O_{15}$, $SrBi_2(Ta_xNb_{1-x})_2O_9$, $(SrBi_2Ta_2O_9)_{0.7}\cdot(Bi_3TiTaO_9)_{0.3}$, $(SrBi_2(Ta_xNb_{1-x})_2O_9)_{0.7}\cdot(Bi_3TiTaO_9)_{0.3}$, or $Bi_4Ti_3O_{12}$.

6. A method of manufacturing a semiconductor memory device as defined in claim 1, wherein the ferroelectric film is formed by a method of forming a film comprising one of MOD method, sputtering method, vacuum vapor deposition method and MOCVD method.

7. The method of claim 1, further comprising flattening the first interlayer insulating film prior to forming the contact hole.

* * * * *